(12) United States Patent
Mauder et al.

(10) Patent No.: US 10,069,016 B2
(45) Date of Patent: Sep. 4, 2018

(54) SEMICONDUCTOR DIODE WITH TRENCH STRUCTURES AND INCLUDING DOPED LAYERS AND DOPED ZONES OF OPPOSITE CONDUCTIVITY TYPES PROVIDING HIGH SURGE ENERGY CAPACITY

(71) Applicant: Infineon Technologies Austria AG, Villach (AT)

(72) Inventors: Anton Mauder, Kolbermoor (DE); Franz-Josef Niedernostheide, Muenster (DE); Hans-Joachim Schulze, Taufkirchen (DE); Holger Schulze, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/548,388

(22) Filed: Nov. 20, 2014

(65) Prior Publication Data
US 2015/0097262 A1    Apr. 9, 2015

Related U.S. Application Data

(63) Continuation of application No. 13/487,540, filed on Jun. 4, 2012, now Pat. No. 8,921,931.

(51) Int. Cl.
*H01L 29/06*        (2006.01)
*H01L 29/861*       (2006.01)
(Continued)

(52) U.S. Cl.
CPC .......... *H01L 29/861* (2013.01); *H01L 21/761* (2013.01); *H01L 21/76224* (2013.01);
(Continued)

(58) Field of Classification Search
None
See application file for complete search history.

(56) References Cited

U.S. PATENT DOCUMENTS

| | | | |
|---|---|---|---|
| 8,921,931 B2* | 12/2014 | Mauder | 257/328 |
| 2002/0084490 A1* | 7/2002 | Ker | H01L 27/0255 257/355 |

(Continued)

FOREIGN PATENT DOCUMENTS

| | | |
|---|---|---|
| CN | 1146826 A | 4/1997 |
| CN | 102084487 A | 6/2011 |

(Continued)

*Primary Examiner* — Jay C Chang
(74) *Attorney, Agent, or Firm* — Murphy, Bilak & Homiller, PLLC

(57) ABSTRACT

A semiconductor diode includes a semiconductor body and trench structures extending from a surface of the semiconductor body into the semiconductor body. The semiconductor body includes a doped layer of a first conductivity type and a doped zone of a second conductivity type opposite to the first conductivity type. The doped zone is formed between the doped layer and a first surface of the semiconductor body. The trench structures are arranged between electrically connected portions of the semiconductor body. The trench structures do not include conductive structures that are both electrically insulated from the semiconductor body and electrically connected with another structure outside the trench structures.

25 Claims, 10 Drawing Sheets

(51) Int. Cl.
*H01L 29/872* (2006.01)
*H01L 21/761* (2006.01)
*H01L 21/762* (2006.01)

(52) U.S. Cl.
CPC ...... *H01L 29/0619* (2013.01); *H01L 29/0649* (2013.01); *H01L 29/0692* (2013.01); *H01L 29/872* (2013.01)

(56) References Cited

U.S. PATENT DOCUMENTS

| | | |
|---|---|---|
| 2002/0179925 A1 | 12/2002 | Tihanyi |
| 2006/0226488 A1* | 10/2006 | Schneider ........... H01L 27/0259 257/362 |
| 2007/0023830 A1 | 2/2007 | Pfirsch et al. |
| 2007/0221952 A1 | 9/2007 | Thorup et al. |
| 2008/0012050 A1* | 1/2008 | Aoki ................... H01L 29/0696 257/262 |
| 2008/0164518 A1* | 7/2008 | Darwish ............. H01L 29/0649 257/331 |
| 2009/0189218 A1 | 7/2009 | Pan |
| 2010/0117144 A1 | 5/2010 | Hirler et al. |
| 2011/0127650 A1* | 6/2011 | Witvrouw ........... B81C 1/00333 257/622 |
| 2013/0175529 A1* | 7/2013 | Mauder ................ H01L 29/861 257/51 |

FOREIGN PATENT DOCUMENTS

| | | |
|---|---|---|
| CN | 102272932 A | 12/2011 |
| CN | 102446845 A | 5/2012 |
| DE | 10031461 | 6/2006 |

\* cited by examiner

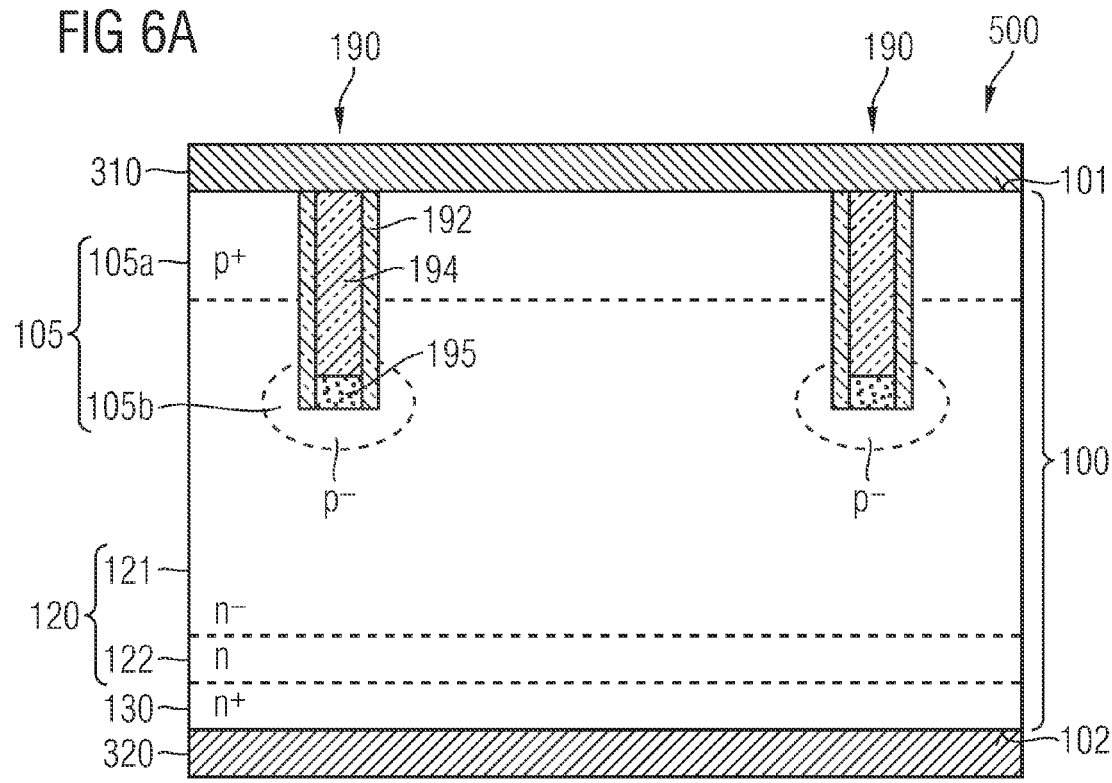
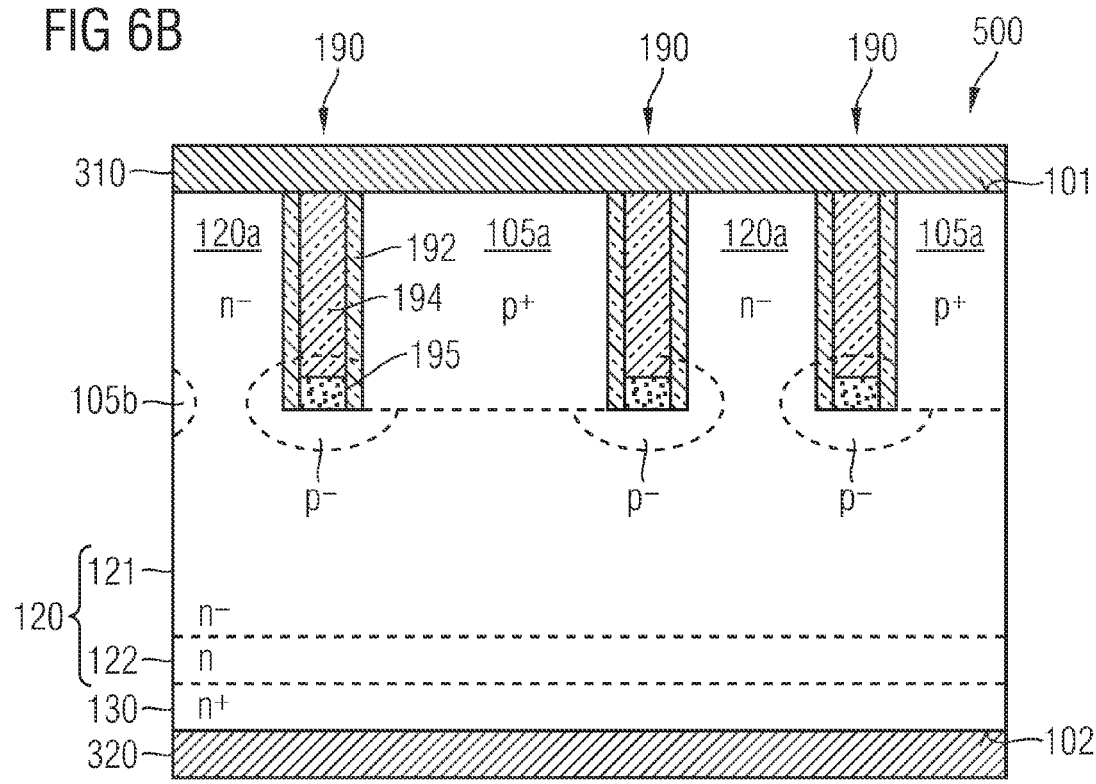

SEMICONDUCTOR DIODE WITH TRENCH STRUCTURES AND INCLUDING DOPED LAYERS AND DOPED ZONES OF OPPOSITE CONDUCTIVITY TYPES PROVIDING HIGH SURGE ENERGY CAPACITY

BACKGROUND

Manufacturing of semiconductor devices includes providing semiconductor wafers with metal layers having a thickness of 10 micrometers and more on a semiconductor substrate having a thickness of 200 micrometers or less. The metal layer may bend the semiconductor wafer by several millimeters. The bending hampers subsequent processing of the semiconductor wafers and may cause fissures that result in a decrease of production yield. Typically buffer layers between the metal layer and the semiconductor material, for example ductile layers, compensate for mechanical stress between the metal layer and the semiconductor material. It is desirable to further increase production yield for semiconductor devices having high surge energy capacity and cosmic radiation robustness at low switching losses.

SUMMARY

According to an embodiment a semiconductor diode includes a semiconductor body including a doped layer of a first conductivity type and one or more doped zones of a second conductivity type, which is the opposite of the first conductivity type. The one or more doped zones are formed between the doped layer and a first surface of the semiconductor body. Trench structures extend from one of the first and a second opposing surface into the semiconductor body. The trench structures are arranged between portions of the semiconductor body which are electrically connected to each other. The trench structures do not include conductive structures that are both electrically insulated from the semiconductor body and electrically connected with another structure outside the trench structures.

According to another embodiment a semiconductor diode includes a semiconductor body that includes a doped layer of a first conductivity type and a doped zone of a second conductivity type opposite to the first conductivity type, wherein the doped zone is formed between the doped layer and a first surface of the semiconductor body. Trench structures extend from one of the first and a second opposing surface into the semiconductor body. The trench structures include a recombination structure at the bottom, respectively. The recombination structures directly adjoin the doped zone and exhibit a surface recombination rate of at least $10^4$ cm/s at an interface to the doped zone.

According to another embodiment, a method of manufacturing a semiconductor diode includes etching trenches from a first surface into a semiconductor body, wherein the semiconductor body includes one or more doped zones of a second conductivity type adjoining the first surface and a doped layer of a first conductivity type which is opposite to the second conductivity type, the doped layer forming a planar interface parallel to the first surface. A dielectric structure is provided on sidewalls of the trenches. A recombination structure is provided at the bottom of the trenches, respectively.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 6A is a schematic cross-sectional view of a portion of a semiconductor device in accordance with an embodiment related to outdiffused segments of a field stop portion at the bottom of trench structures including recombination structures.

FIG. 6B is a schematic cross-sectional view of a portion of a semiconductor device in accordance with an embodiment related to a merged pin Schottky diode.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by the same references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The Figures illustrate relative doping concentrations by indicating "−" or "+" next to the doping type "n" or "p". For example "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

Figure 1A:
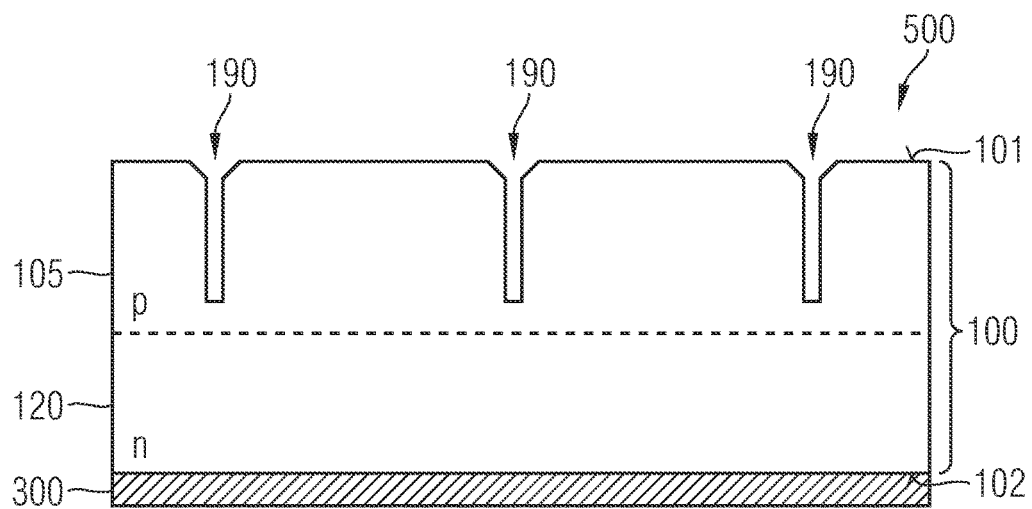
FIG. 1A is a schematic cross-sectional view of a portion of a semiconductor device in accordance with an embodiment providing trench structures for relaxing mechanical stress.

FIG. 1A shows a semiconductor body 100 of a semiconductor device 500. The semiconductor body 100 is provided from a monocrystalline semiconductor material, for example silicon Si, silicon carbide SiC, germanium Ge, a silicon-germanium crystal SiGe, gallium nitride GaN or gallium arsenide GaAs. The semiconductor body 100 has a first surface 101 and a second surface 102, which is parallel to the first surface 101 on the opposite side of the semiconductor body 100. A distance between the first and the second surface 101, 102 is in the range of hundred micrometers or more and is a function of the reverse breakdown voltage specified for the semiconductor device 500, wherein the reverse breakdown voltage is the minimum applied voltage in reverse direction that causes the semiconductor device 500 to break down. The semiconductor body 100 may have a cell area and an edge area surrounding the cell area. The edge area may include an edge termination construction sustaining the desired reverse breakdown voltage also along the first surface 101 of the semiconductor body 100. The cell area may have an approximately rectangular shape with rounded corners and the edge termination construction may have a length in the range of several millimeters. The normal to the first and second surfaces 101, 102 defines a vertical direction and directions orthogonal to the normal are lateral directions.

The semiconductor body 100 includes a doped layer 120 of a first conductivity type and a doped zone 105 of a second conductivity type, which is the opposite of the first conductivity type. In the illustrated embodiment, the first conductivity type is n-type and the second conductivity type is p-type. According to another embodiment, the first conductivity type is p-type and the second conductivity type is n-type. The doped zone 105 and the doped layer 120 form a pn-junction extending in substance parallel to the first and the second surfaces 101, 102. The doped layer 120 may directly adjoin the second surface 102. According to other embodiments further doped layers may be arranged between the doped layer 120 and the second surface 102.

The semiconductor device 500 may further include at least one metal layer 300 which is in direct contact with at least sections of the first surface 101 or the second surface 102. According to the illustrated example, the metal layer 300 is in direct contact with approximately the complete second surface 102. The metal layer 300 may consist of or contain, as main constituent(s), aluminum Al, copper Cu or alloys of aluminum or copper, for example AlSi, AlCu or AlSiCu. According to other embodiments, the metal layer 300 contains, as main constituents, nickel Ni, titanium Ti, silver Ag, gold Au, platinum Pt and/or palladium Pd. For example, the metal layer 300 may include one or more sub-layers, each sub-layer containing one or more of Ni, Ti, Ag, Au, Pt, Pd as main constituents and/or alloys therefrom.

The semiconductor device 500 includes further layers, sub-layers, doped regions or electrodes. For example, the semiconductor device 500 is a power semiconductor diode, where the metal layer 300 forms a cathode electrode and an anode electrode is provided in contact with the first surface 101. The doped zone 105 may include a highly doped base portion for increasing anode efficiency and a lower doped field stop portion. The doped layer 120 may include one or more sub-layers, for example a highly doped portion for increasing cathode efficiency, a lower doped field stop portion and/or a low-doped drift portion. According to other embodiments, the semiconductor device 500 is an IGFET (insulated gate field effect transistor) with the metal layer 300 providing a drain electrode. N-doped source zones may be provided adjoining the first surface 101 and electrically connected to a source electrode provided above the first surface 101. Gate electrodes may control a current flow between the source zones and a drain region formed by the doped layer 120. According to another embodiment, the semiconductor device 500 is an IGBT (insulated gate bipolar transistor) with a further p-type layer formed between the metal layer 300 and the n-type doped layer 120.

Due to different thermal expansion coefficients of the metal layer 300 and the semiconductor body 100, during manufacturing of the semiconductor device 500 a wafer assembly including a plurality of mechanical connected semiconductor dies for the semiconductor devices 500 may bend or sag by several millimeters.

According to some embodiments, trench structures 190 extend from the first surface 101 into the semiconductor body 100. According to other embodiments, the trench structures 190 may extend from the second surface 102 into the semiconductor body 100. The trench structures 190 mitigate and relax or compensate for mechanical stress resulting from different thermal expansion coefficients of the metal layer 300 and the semiconductor body 100. Other than conventional buffer layers such as TiW- or TiN-layers, the trench structures 190 are highly effective even with metal layers having a thickness of 20 micrometer or more as used for power semiconductor devices. The trench structures 190 significantly reduce the bending of the wafer assembly and avoid fissures in the wafer assembly. The number and arrangement of the trench structures 190 as well as the depth and the width of the trench structures 190 may vary in different portions of the semiconductor device 500. According to the illustrated embodiment, the trench structures 190 contain a gaseous fluid, for example nitrogen or atmospheric air.

The depth of the trench structures 190 with regard to the first surface 101 may be in the range of 1 to 20 micrometers. A mean distance between directly neighboring trench structures 190 may be equal to or greater than 1.0 micrometer or equal to 30 micrometer or less. A width of the trench structures 190 may be equal to or greater than 0.3 micrometer or 3 micrometer or less. Other than known shallow trench isolation structures, the trench structures 190 are formed between electrically connected portions of the semiconductor body 100.

Figure 1B:
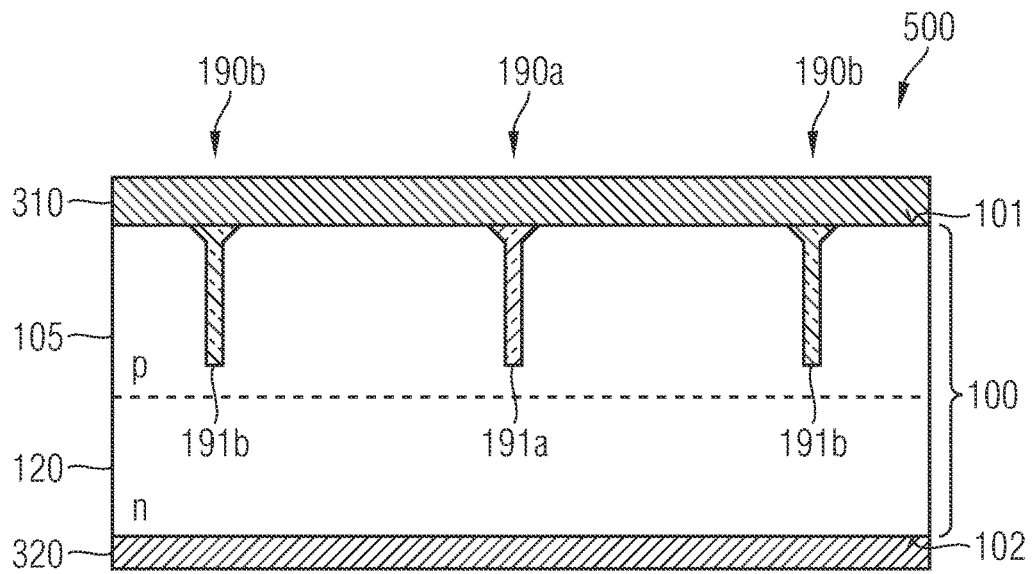
FIG. 1B is a schematic cross-sectional view of a portion of a semiconductor diode in accordance with an embodiment providing different trench structures.

According to the embodiment of FIG. 1B, first trench structures 190a are filled with a first fill material or a first material combination 191a and second trench structures 190b are filled with a second fill material or material combination 191b. The first and second materials or material combinations 191a, 191b may exhibit different thermal expansion coefficients allowing a local fine-tuning of a compensation of mechanical stress. The first and second materials or material combinations 191a, 191b may be dielectric materials and dielectric material combinations, by way of example, wherein the term "dielectric material" includes gaseous fluids like nitrogen or atmospheric air.

The portions of the semiconductor body 100 on opposite sides of the trench structures 190 are electrically connected to a first electrode layer 310 provided above or directly on the first surface 101. A second electrode layer 320 is provided in direct contact with the second surface 102.

Figure 2A:
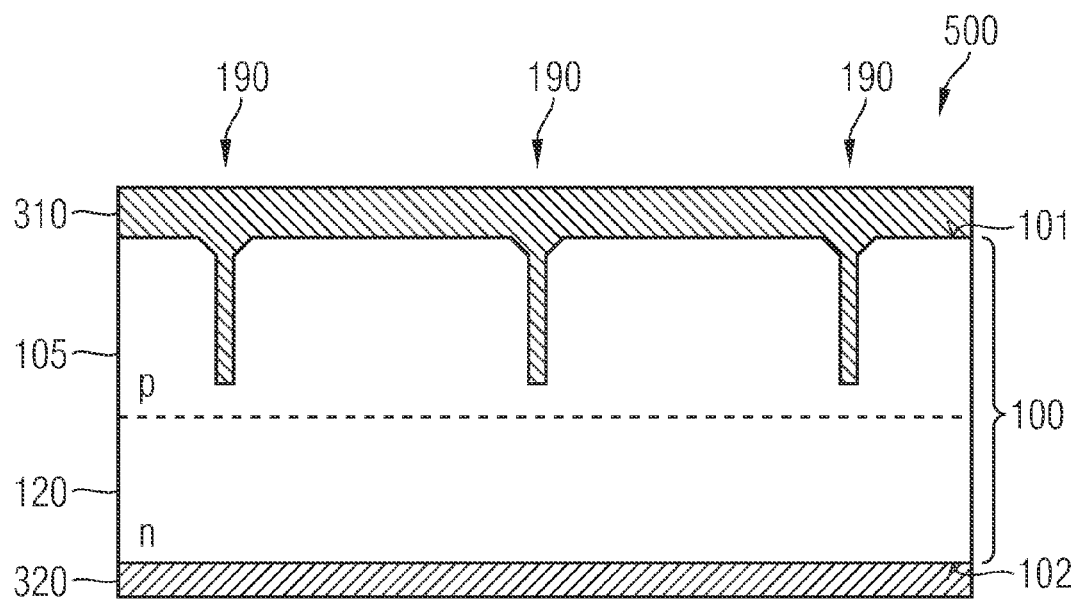
FIG. 2A is a schematic cross-sectional view of a portion of a semiconductor diode in accordance with an embodiment related to metal filled trench structures.

FIG. 2A shows a first electrode layer 310 that includes first portions forming trench structures 190 extending from the first surface 101 into the semiconductor body 100 and a second portion outside the contour of the semiconductor body 100 and in direct contact with the first surface 101. A second metal layer 320 directly adjoins the second surface 102.

The semiconductor device 500 of FIG. 2A provides a diode with the first metal layer 310 forming an anode electrode and the second metal layer 320 forming a cathode electrode. The trench structures 190 made of the material of the first electrode layer 310 directly adjoin the semiconductor body 100. A maximum depth of the trench structures 190 with regard to the first surface 101 may be less than a distance between the first surface 101 and the pn-junction formed by the interface between the doped zone 105 and the doped layer 120. According to an embodiment, the distance between a bottom surface or edge at the bottom of the trench structures 190 and the pn-junction is selected such that a depletion zone extending from the pn-junction in the direction of the first surface 101 and/or in the direction of the trench structures 190 does not reach any of the trench structures 190 at the reverse breakdown voltage specified for the semiconductor device 500.

Figure 2B:
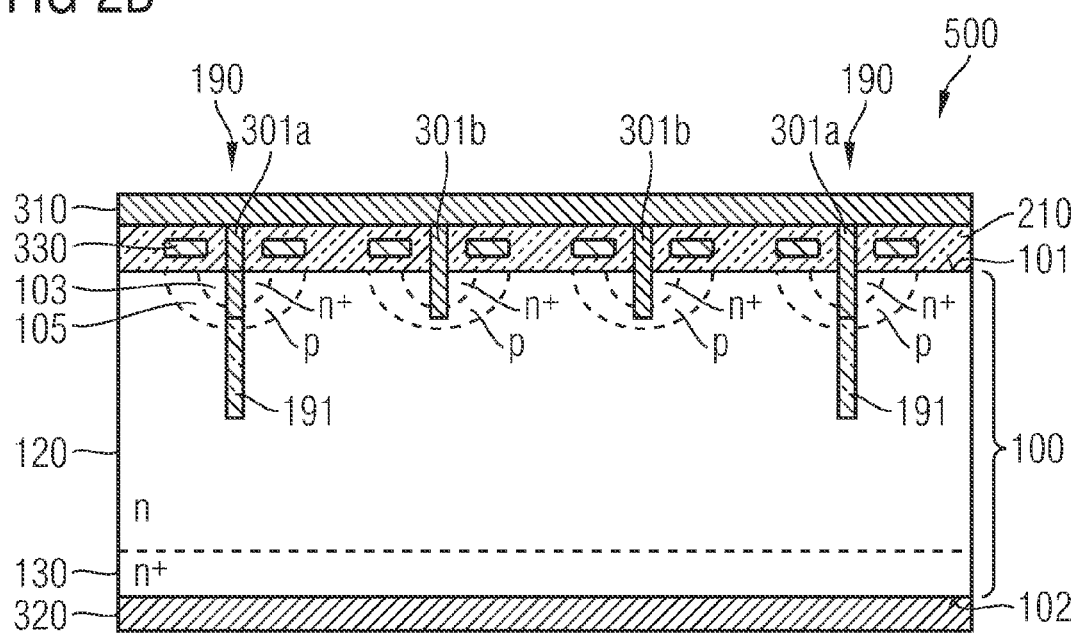
FIG. 2B is a schematic cross-sectional view of a portion of a semiconductor device in accordance with an embodiment related to an IGFET (insulated gate field effect transistor) providing trench structures.

In FIG. 2B the semiconductor device 500 is an IGFET. A semiconductor body 100 includes a doped layer 120 of the first conductivity type and a plurality of doped zones 105 of the second conductivity type. According to an embodiment, the doping of the doped zones 105 may be lower at the boundary to the doped layer 120 and at the boundary to the first surface 101 and may be higher in the direction to the trench structures 190.

The doped layer 120 may provide an n-type drift layer and the doped zones 105 may form p-type body regions. The semiconductor body 100 further includes n-type source zones 103 formed adjoining the first surface 101, wherein the doped zones 105 separate the source zones 103 from the doped layer 120. An n-type substrate layer 130 may be provided between the doped layer 120 and the second surface 102, wherein the substrate layer 130 has a net dopant concentration that is higher than that of the doped layer 120.

According to an embodiment, the doping of the substrate layer 130 may be lower at the boundary to the doped layer 120 and may be higher in the direction to the second surface 102.

Gate electrode structures 330 are formed above the first surface 101 and are arranged such that a potential at the gate electrode structures 330 controls the charge carrier distribution in portions of the doped zones 105 adjoining the first surface 101 through an intermediate gate dielectric. In an on-state of the IGFET, minority charge carriers form a conductive channel between the source zones 103 and the doped layer 120 in a channel portion of the doped zones 105 adjoining to the first surface 101 below the gate electrode structures 330.

A dielectric layer structure 210 separates the gate electrode structures 330 from the semiconductor body 100 and a first electrode layer 310 providing a source electrode. In openings of the dielectric layer structure 210 contact portions 301a, 301b of the first electrode layer 310 are in direct contact with the semiconductor body 100. The contact portions 301a, 301b may directly lie on the first surface 101 or may extend into the semiconductor body 100. According to other embodiments, the contact portions 301a, 301b may also contact the doped zones 105. A surface portion of the first electric layer 310 bears on the dielectric structure 210. A second electrode layer 320 providing a drain electrode may be formed in direct contact with the second surface 102.

The semiconductor device 500 further includes trench structures 190. The trench structures 190 may be spaced at distances from 0.2 to 40 micrometers. The distances may be approximately equal. A width of the trench structures 190 may be in the range of 0.1 to 4 micrometers and a total depth of the trench structures 190 may be in the range from 0.1 to 20 micrometers.

The trench structures 190 may be formed in areas, where the doped layer 120 adjoins to the first surface 101. For avoiding loss of area effective for the forward current, according to the illustrated embodiment the first contact portions 301a form an upper portion of one of the trench structures 190, respectively. Each trench structure 190 includes a further portion 191 extending from the bottom of the first contact portion 301a into the semiconductor body 100. The further portions 191 may be provided from a dielectric material or a combination of dielectric materials 191. The further portions 191 may be absent below second contact portions 301b. In the illustrated cross-sectional plane, a width of first contact portions 301a not forming part of trench structures 190 may be approximately equal to a width of the trench structures 190. According to an embodiment, the width of the trench structures 190 containing a dielectric material may be bigger than the width of first contact portions 301a not included in trench structures 190. The first contact portions 301a may have a depth in the range from 0.1 to 1.0 micrometer.

According to an embodiment, the trench structures 190 are further arranged to reduce charge carrier mobility in a portion of the semiconductor body 100 close to the pn-junction. The trench structures may be used to locally increase or decrease mechanical strain thereby locally reducing charge carrier mobility in order to improve the blocking characteristics of the semiconductor device 500. According to an embodiment, the trench structures 190 cross the pn-junction between the doped zone 105 and the doped layer 120.

Figure 3A:
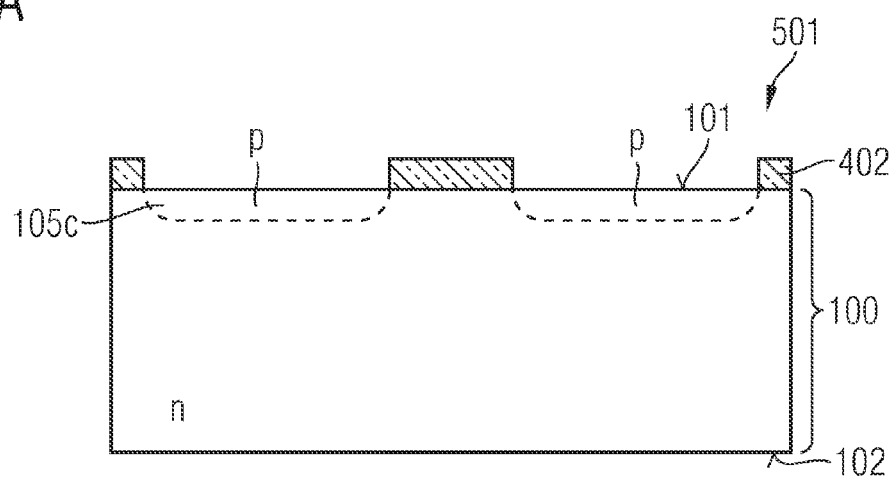
FIG. 3A is a schematic cross-sectional view of a portion of a semiconductor die during manufacturing for illustrating an embodiment related to a method of manufacturing semiconductor devices after implanting wells of a second conductivity type in a layer of a first conductivity type.
Figure 3B:
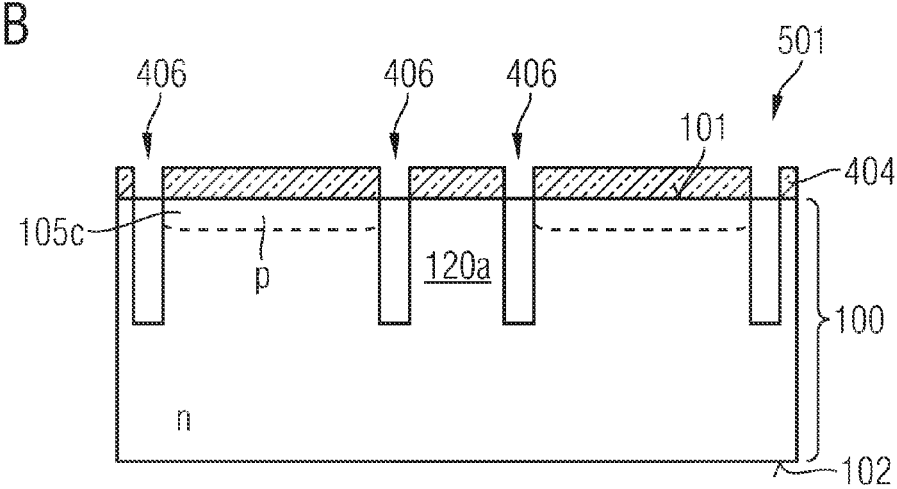
FIG. 3B is a schematic cross-sectional view of the semiconductor die of FIG. 3A after providing trench structures confining the wells of the second conductivity type.
Figure 3C:
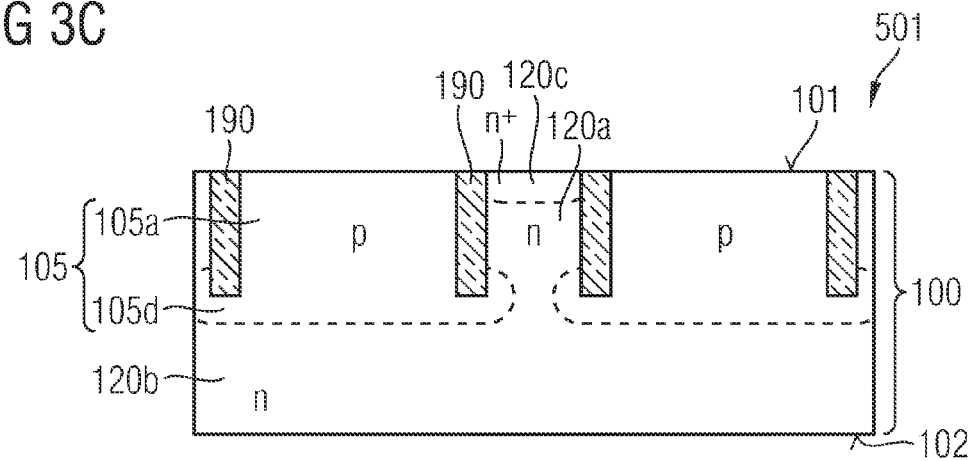
FIG. 3C is a schematic cross-sectional view of the semiconductor die of FIG. 3B after an anneal.

FIGS. 3A to 3C refer to an embodiment using trench structures 190 for improving the surge current capability of a diode. According to FIG. 3A a dopant mask 402 is provided on a first surface 101 of an n-type semiconductor body 100 of a semiconductor die 501. Through openings in the dopant mask 402, p-type impurities are introduced to form shallow wells 105c, for example by a diffusion process or by an implant process. The dopant mask 402 is removed. An etch mask layer 404 is deposited on the first surface 101 and patterned by lithographic methods. Through openings in the etch mask 404 trenches 406 are etched into the semiconductor body 100, wherein the trenches 406 separate the p-doped shallow wells 105c from n-type portions of the semiconductor body adjoining the first surface 101. A thermal anneal is performed such that the p-type impurities diffuse from the shallow wells 105c into adjoining portions of the semiconductor body 100. The diffusion process is stopped after the p-type impurities have diffused to a sufficient degree around the end portions of the trenches 406.

FIG. 3C shows the resulting shape of the p-type doped zones 105 emerging from the diffusion of p-type impurities starting from the arrangement of FIG. 3B. Trench structures 190, which may be obtained by filling the trenches 406 of FIG. 3B, separate doped zones 105 from extension portions 120a of a doped layer 102 of the n-type. The doped layer 102 further includes a contiguous portion 120b forming pn-junctions with the doped zones 105 and directly adjoining the extension portions 120a. The pn-junctions extend in substance parallel to the first surface 101. According to an embodiment, the extension portions 120a may include a highly doped contact portion 120c directly adjoining the first surface 101.

A distance between the pn-junctions and the first surface 101 is greater than a maximum distance between a bottom surface of the trench structures 190 and the first surface 101. Each doped zone 105 includes a base portion 105a between the adjoining trench structures 190 and a diffusion portion 105d which below the trench structures 190 extends in the lateral direction in direction of the extension portions 120a of the doped layer 120. A distance between directly neighboring diffusion portions 105d of neighboring doped zones 105 is smaller than a maximum width of the extension portion 120a between neighboring trench structures 190.

The trench structures 190 allow for defining exactly the lateral extension of the diffusion portions 105d in a predefined distance to the first surface 101. The possibility to define the lateral extension very precisely allows for providing a comparatively small distance between neighboring diffusion portions 105d. The widths of the extension portions 120a in a section narrowed by the diffusion zones 105d can be precisely adjusted even for narrow extension portions 120a. Provided that the extension portions 120a are sufficiently narrow, a high surge energy capacity can be combined with a high reverse breakdown voltage.

Figure 4A:
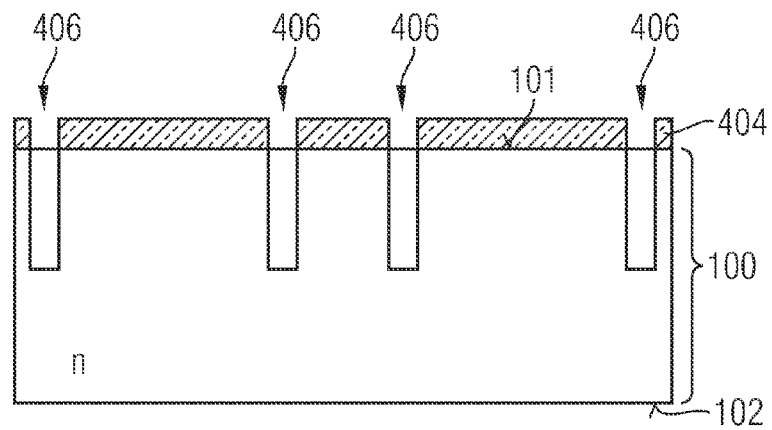
FIG. 4A is a schematic cross-sectional view of a portion of a semiconductor die during manufacturing for illustrating an embodiment related to a further method of manufacturing semiconductor devices after forming trenches.
Figure 4B:
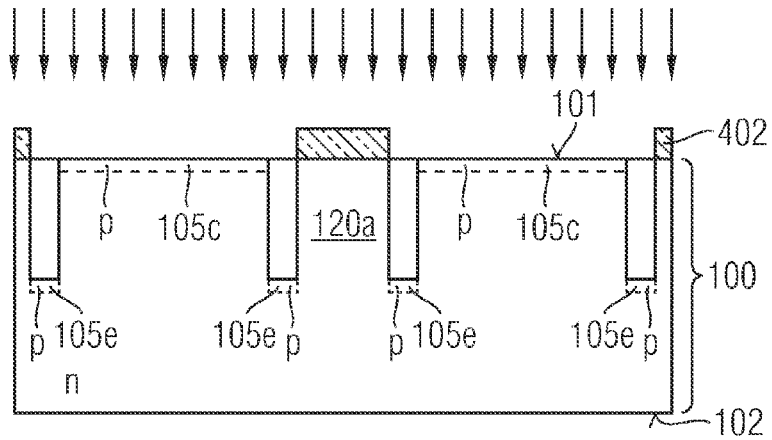
FIG. 4B is a schematic cross-sectional view of the semiconductor die of FIG. 4A during introducing impurities through the trench structures.
Figure 4C:
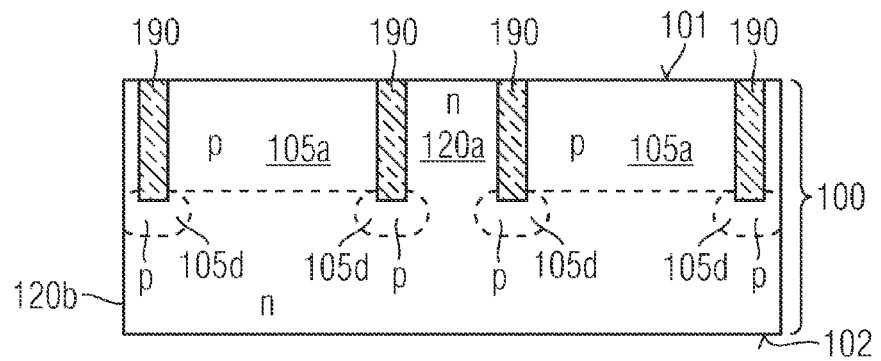
FIG. 4C is a schematic cross-sectional view of the semiconductor die of FIG. 4B after an anneal.

FIGS. 4A to 4C refer to an embodiment where impurities introduced through the trench bottoms shape the diffusion portions 105d in a semiconductor body 100. As shown in FIG. 4A, trenches 406 may be etched into the semiconductor body 100 through openings in an etch mask 404.

A dopant mask 402 is formed as shown in FIG. 4B. According to an embodiment, the etch mask 404 of FIG. 4A is removed, a dopant mask layer is deposited and patterned by lithographic means. According to another embodiment, the dopant mask 402 may be formed from portions of the etch mask 406 of FIG. 4A. The dopant mask 402 exposes the openings of the trenches 406 and sections of the first surface 101. P-type impurities are introduced through the openings in the dopant mask 402, for example by an implant or by outdiffusion from a gaseous phase or an impurity layer. P-type impurities introduced through the bottom areas of the trenches 406 form trench-aligned wells 105e in the semiconductor body 100. P-type impurities introduced through exposed sections of the first surface 101 form shallow wells 105c.

According to another embodiment, the shallow wells 105c and the trench-aligned wells 105e may result from using two different processes of introducing implants using different dopant masks and/or different impurity doses. According to an embodiment, through the bottom areas of the trenches 406 impurities are introduced at a lower dose than through exposed sections of the first surface 101. A thermal anneal is performed such that the p-type impurities diffuse out from the shallow wells 105c and the trench-aligned wells 105e into adjoining portions of the semiconductor body 100.

As illustrated in FIG. 4C, the diffusion process may be stopped after the trench-aligned wells 105e have formed diffusion portions 105d interconnected with base portions 105a emerging from the shallow wells 105c. Other than with the embodiment of FIGS. 3A to 3C, with the embodiment of FIGS. 4A to 4C, the remaining width between neighboring diffusion portions 105d is largely independent from process-induced depth variations of trench structures 190 provided by filling the trenches 406 of FIG. 4B with, e.g. one or more dielectric materials. In this case the pn-junction formed between the doped zones 105 and the doped layer 120b may have a notch as shown by the dotted line in FIG. 4C.

Figure 5A:
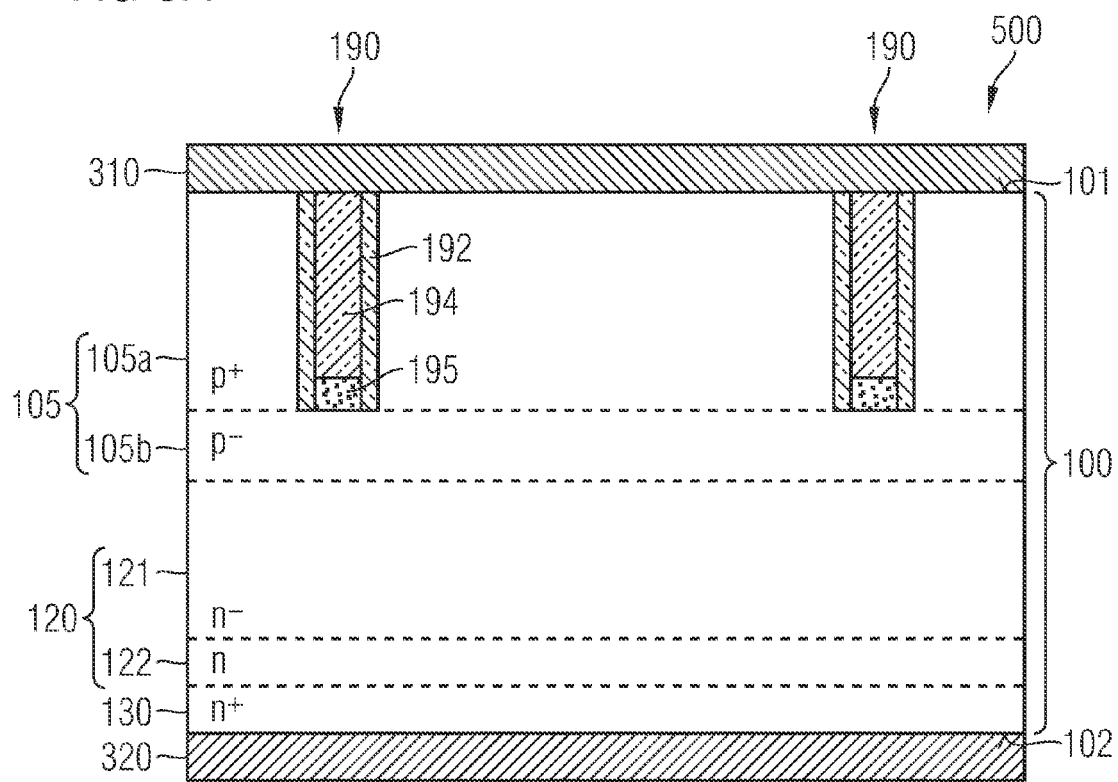
FIG. 5A is a schematic cross-sectional view of a portion of a semiconductor device in accordance with an embodiment providing recombination structures at the bottom of trench structures in a distance to a pn-junction.

FIG. 5A refers to an embodiment using trench structures 190 for providing semiconductor devices 500 combining low switching losses, high surge energy capacity and high cosmic radiation robustness. The semiconductor device 500 includes a semiconductor body 100 with a first surface 101 and a second, opposing surface 102. A first electrode layer 310 may be formed in direct contact with the first surface 101 and a second electrode layer 320 may be formed in direct contact with the second surface 102. The first and second electrode layers 310, 320 are metal layers that may comprise copper Cu, aluminum Al, nickel Ni, titanium Ti, silver Ag, gold Au, platinum Pt, palladium Pd, as main constituent(s) or alloys or layers containing copper Cu and/or aluminum Al, for example AlCu, AlSi or AlSiCu or the aforementioned materials.

The semiconductor body 100 includes a doped layer 120 of the first conductivity type and a doped zone 105 of the second conductivity type. In the illustrated embodiment, the first conductivity type is n-type and the second conductivity type is p-type. According to other embodiments, the first conductivity type is p-type and the second conductivity type is n-type. The semiconductor device 500 provides a power semiconductor diode with the first electrode layer 310 providing an anode electrode and the second electrode layer 320 providing a cathode electrode. The doped zone 105 is arranged between the doped layer 120 and the first surface 101. The doped layer 120 is oriented to the second surface 102 and may directly adjoin the second surface 102 and the second electrode layer 320. According to the illustrated embodiment, a highly doped substrate layer 130 of the first conductivity type is provided between the doped layer 120 and the second surface 102. The doped layer 120 may include a lower doped drift portion 121 and a higher doped field stop portion 122 arranged oriented to the second surface 102 wherein the net dopant concentration in the field stop portion 122 is greater than in the drift portion 121 and lower than in the substrate layer 130. The doped zone 105 may include a highly doped base portion 105a oriented to the first surface 101 and a lower doped field stop portion 105b forming a pn-junction with the drift portion 121 of the doped layer 120.

Trench structures 190 extend from the first surface 101 into the semiconductor body 100. According to the illustrated embodiment, the trench structures 190 approximately extend up to an interface between the base portion 105a and the field stop portion 105b of the doped zone 105. A vertically integrated net dopant concentration in the field stop portion 105b may be in the range from $5\times10^{11}$ cm$^{-2}$ to $10^{13}$ cm$^{-2}$ for example in the range from $10^{12}$ cm$^{-2}$ to $2\times10^{12}$ cm$^{-2}$. A vertically integrated net dopant concentration in the base portion 105a may be in the range from $5\times10^{13}$ cm$^{-2}$ to $10^{16}$ cm$^{-2}$ for example in the range from $5\times10^{14}$ cm$^{-2}$ to $5\times10^{15}$ cm$^{-2}$. According to another embodiment, the trench structures 190 may extend into the field stop portion 105b of the doped layer 105. Some, a majority or all of the trench structures 190 include a recombination structure 195. For each concerned trench structure 190, the recombination structure 195 directly adjoins the field stop portion 105b of the doped zone 105 at a bottom surface forming a buried edge of the trench structures 190. The bottom surface may be flat and approximately parallel to the first and second surfaces 101, 102. According to other embodiments, the bottom surface of the trench structures 190 may be bowed or curved.

The trench structures 190 may further include dielectric structures 192 separating the recombination structure 195 from the semiconductor body 100 in a lateral direction parallel to the first surface 101. The dielectric structures 192 insulate the recombination structures 195 from the highly doped base portion 105a of the doped zone 105. The material of the dielectric structure 192 may consist of or contain silicon nitride, silicon oxide or silicon oxynitride, by way of example. The dielectric structures 192 may be provided by an oxidation of the material of the semiconductor body 100 or by a conformal deposition of a dielectric material ahead of the formation of the recombination structures 195, wherein the deposited or grown dielectric material may be subjected to an anisotropic etch removing the dielectric material at the trench bottom while maintaining the dielectric material at least along the trench sidewalls.

A fill structure 194 may be provided between the first surface 101 and the recombination structure 195 and the dielectric structure 192. According to an embodiment, the material of the fill structure 194 is the same as the material of the dielectric structure 192. The material or a material combination forming the fill structure 194 may consist of or contain silicon oxide, silicon nitride, a gaseous fluid like e. g. nitrogen or atmospheric air, or a silicon glass, for example BPSG (boron-phosphorous-silicate-glass), BSG (boron-silicate-glass), PSG (phosphorous-silicate-glass) or a stack of layers containing one or more of these materials. According to another embodiment, the fill material consists of or contains a semiconductor material, for example intrinsic semiconductor material, amorphous silicon or doped silicon. The fill structure 194 may include a combination of various materials for achieving a sufficient compensation of mechanical stress. The fill material may contain conductive material, wherein the conductive material is without electrical connection to other conductive structure outside the trench structures and/or without electrical connection to the recombination structures 195.

At the bottom surface, the recombination structure 195 exhibits a surface recombination rate which is much greater than the recombination rates of typical semiconductor-to-insulator interfaces. For example, perfect Si-to-SiO$_2$ interfaces have a recombination rate in the range of 30 . . . 100 cm/s. When a higher density of traps is present at the interface recombination rates in the range up to $10^4$ cm/s can be observed. The surface recombination rates provided by the recombination structure 195 may be greater than $10^4$ cm/s, or greater than $10^5$ cm/s or even greater than $10^6$ cm/s.

According to an embodiment, the recombination structure 195 consists of or contains a metal or a metal compound, for example a conductive metal silicide like CoSi$_2$, HfSi$_2$, MoSi$_2$, NiSi$_2$, PdSi$_2$, PtSi, TaSi$_2$, TiSi$_2$, WSi$_2$ or ZrSi$_2$ having a high temperature stability such that the recombination structure 195 can be provided at an early stage of the manufacturing process. In accordance with an embodiment, CoSi$_2$ or TiSi$_2$ is used since these two silicides can be provided in trenches with high aspect ratios. According to other embodiments, the recombination structure 195 is provided from aluminum or an aluminum compound like AlSi or AlSiCu which can be deposited and etched in an economic way. In accordance with other embodiments, the recombination structures 195 are provided from distorted monocrystalline semiconductor material, provided for example by an implant at high implant doses and/or implant energy or by depositing amorphous, nanocrystalline, microcrystalline or polycrystalline semiconductor material. The further manufacturing process is controlled to secure that the damaged crystal maintains the desired recombination characteristics for the finalized semiconductor device 500.

The recombination structure 195 pins the carrier flooding at an interface to the field stop portion 105b to zero. As a consequence, the charge flooding at the first surface 101 can be defined by the distance between the recombination structures 195 and, to a certain degree, by the lateral extension of the recombination structures 195. The net dopant concentration of the field stop portion 105b of the doped zone 105 determines the amount of carrier flooding in the drift portion 121 of the doped layer 120 when the net dopant concentration reaches a significant portion of the carrier flooding. A charge carrier concentration, from which on the recombination structures 195 start to become effective is defined by the maximum dopant concentration. As a consequence, the maximum dopant concentration can be used for tuning the forward and the switching characteristics of the semiconductor device 500 as a function of the pre-current density. The lower the net dopant concentration in the field stop portion 105b is, the lower is the charge carrier density achievable for the field stop portion 105b of the doped zone 105.

As a consequence the net dopant concentration of the highly doped base portion 105a does not influence the dynamic characteristics of the semiconductor device 500. A high value for the net dopant concentration in the base portion 105a of the doped zone 105 can be provided without negative influence on the dynamic characteristics of the semiconductor device 500. A highly doped base portion 105a increases cosmic radiation robustness and commutation robustness. Additionally, a highly doped base portion 105a may provide higher conductivity during surge pulse operation and thus provide higher surge current capability.

The field stop portion 105b is in substance arranged between a bottom surface of the trench structures 190 and the doped layer 120. The integrated net dopant concentration of the field stop portion 105b is equal to or greater than the height of the breakdown charge, wherein in silicon the breakdown charge is approximately $1 \times 10^{12}$ p-type impurity atoms per $cm^2$.

According to the embodiment of FIG. 5A, the field stop portion 105b of the doped zone 105 is a contiguous layer forming approximately planar interfaces both with the doped layer 120 and the base portion 105a of the doped zone 105. At the interface of the field stop portion 105b to the base portion 105a of the doped zone 105 the doping concentration may be the same or may differ from the doping concentration in the base portion 105a of the doped zone 105. The doping concentration of the doped zone 105 may vary in a vertical direction over the depth into the semiconductor body 100. The doping level at the trench bottom may be used to define an interface between the base portion 105a and the field stop portion 105b.

Figure 5B:
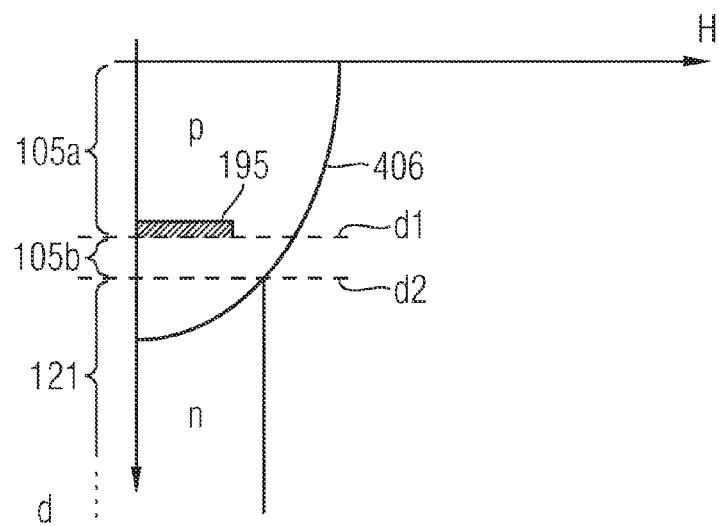
FIG. 5B is a schematic diagram for illustrating impurity profiles in accordance with an embodiment related to the semiconductor device of FIG. 5A.

FIG. 5B refers to an embodiment with the field stop portion 105b and the base portion 105a of the doped zone 150 resulting from the same doping source, e.g. implant or diffusion source. The diagram gives dopant concentrations H as a function of a distance d to the first surface 101. For example boron (B) may be implanted at a high dose, for example at a dose of $5 \times 10^{14}$ $cm^{-2}$ or higher and a high energy anneal is performed. For example, the anneal may be performed at a temperature of 1150 degree Celsius or at a lower temperature for more than one hour resulting in the dopant profile 406. At a distance d2 the p-type dopant concentration is equal to the n-type dopant concentration in the drift portion 121 of the doped layer 120 and a pn-junction is formed. At a distance d1 which is closer to the first surface 101 than the distance d2 the recombination structure 195 is formed. A portion of the diffusion zone given by the dopant profile 406 between the recombination structure 195 and the pn-junction defines the field stop portion 105b.

According to another embodiment, the base portion 105a and the field stop portion 105b of the doped zone 105 are formed using separate implants such that a doping profile of the field stop portion 105b overlaps a trailing edge of the doping profile of the base portion 105a such that a field stop portion 105b may be separated from the base portion 105a.

FIG. 6A refers to an embodiment with the field stop portion 105b being spatially separated from the base portion 105a. The distance between the bottom surfaces at the bottom edge of the trench structures 190 and the first surface 101 is greater than the distance between the buried edge of the base portion 105a and the first surface 101. The field stop portion 105b includes a plurality of spatially separated segments, wherein each segment is aligned to one of the trench bottoms. The segments of the field stop portion 105b may be separated from the base portion 105a. According to another embodiment, the segments of the field stop portion 105b may directly adjoin the base portion 105a. Accordingly, the field stop portions 105b may be connected to a potential applied to the anode electrode or may have a potential which is more negative than the anode potential in the reverse mode of the semiconductor device 500.

For forming the field stop portions 105b a p-type dopant may be implanted at least at the bottom of the trench structures 190 before the trench structures 190 are filled or before the recombination structures 195 are formed. The implant is annealed either in a dedicated anneal process or by using the temperature budgets of subsequent processes, wherein the dopant diffuses into the adjoining portions of the semiconductor body 100 to form the segments of the field stop portions 105b. According to an embodiment, the implant is masked and only performed in the trench structures 190. According to another embodiment, the implant is not masked, since the implant dose is significantly lower than the implant dose provided for formation of the base portion 105a.

The distance between the pn-junction and the first surface 101 influences the avalanche characteristics of the semiconductor device 500. The farther the field stop portion 105b extends in the direction of the second surface 102, the more increases, in the reverse mode, the electric field strength at the pn-junction. As a result, the breakdown voltage can be pinned to a cell area of the semiconductor device 500, wherein the doped zone 105 is formed in the cell area whereas at least the base portion 105a is absent in an edge area surrounding the cell area. The semiconductor device 500 can be designed to reliably break through in the cell area before a breakdown condition occurs in the edge area. As a result, avalanche robustness of the semiconductor device 500 is improved. The embodiment can be realized with a stepwise implant of the doped zone 105 using several energy levels. After subsequent processes delivering a certain temperature budget the dopant profile for the doped zone 105 may have a stepwise contour with a certain undulation. Other embodiments may provide stepwise growth of epitaxial layers which are implanted with p-type impurities respectively after each growth step.

FIG. 6B combines features of embodiment FIG. 6A with features of embodiment FIG. 3C. The trench structures 190 are provided between base portions 105a of the doped zones 105 and extension portions 120a of the doped layer 120. The extension portions 120 directly adjoin the first surface 101 and are in substance arranged between the first surface 101 and a buried edge of the base portions 105a of the doped zones 105. The base portions 105a are formed between neighboring trench structures 190. Extension portions 120a of the doped layer 120 and base portions 105a of the doped zones 105 are provided in alternating order.

The base portions 105a may be significantly wider than the extension portions 120a, for example by a factor 2 or greater, for example by a factor 10 or greater. Segments of the field stop portion 105b narrow the connection between the extension portions 120a and a contiguous portion of the doped layer 120 between the lower edges of the field stop portion 105b and the doped layer 130. For example, in the cross-sectional plane, a width of the base portions 105a may be in the range from 1 to 40 micrometer and the width of the extension portions 120a may range from 0.1 to 3 micrometer. A lateral overlap of the field stop portions 105b with the extension portions 120a may be up to 1.5 micrometer.

Figure 7A:
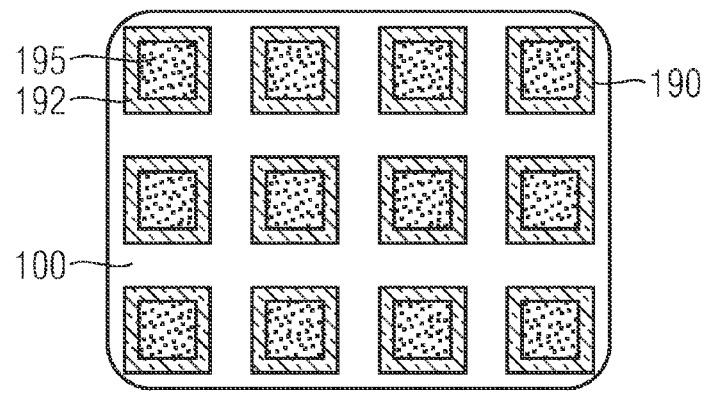
FIG. 7A is a schematic cross-sectional view of a section of a semiconductor device parallel to a first surface of a semiconductor body in accordance with an embodiment related to dot-shaped trench structures.

FIG. 7A shows dot-shaped trench structures 190 with recombination structures 195 and dielectric structures 192 electrically insulating the recombination structures 195 from the surrounding semiconductor body 100. The cross-sectional shape of the dots may be a rectangle with rounded corners, a circle or an ellipsoid. The trench structures 190 may be arranged in a regular pattern. According to other embodiments, the distances between trench structures 190 may be different in different regions of the semiconductor body.

Figure 7B:
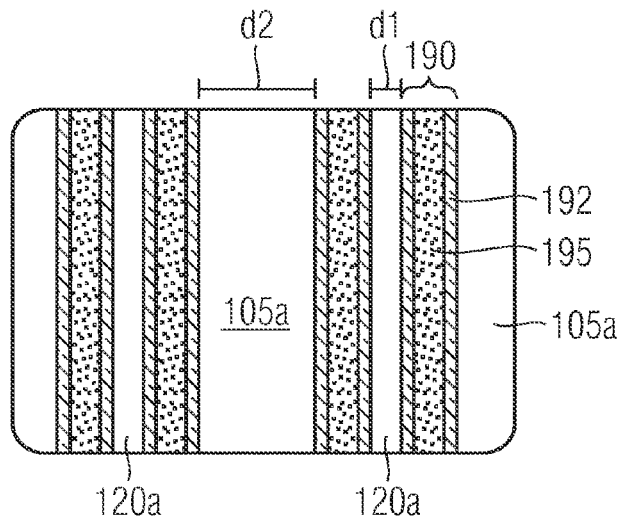
FIG. 7B is a schematic cross-sectional view of a section of a semiconductor device parallel to a first surface of a semiconductor body in accordance with an embodiment related to stripe-shaped trench structures.

FIG. 7B refers to an embodiment with stripe-shaped trench structures 190. A dielectric structure 192 separates the recombination structures 195 from the semiconductor body 100. The trench structures 190 may be arranged in a regular line pattern at equal distances. According to another embodiment, the distances between neighboring trench structures 190 may vary for different regions of the semiconductor device. For embodiments as described with regard to FIG. 6, extension portions 120a of the doped layer 120 may be formed between stripe-shaped trench structures 190 arranged close to each other at a first distance d1 and base portions 105a of the doped zone 105 may be provided between the stripe-shaped trench structures arranged at a second distance d2 which is wider than the first distance d1 by a factor 2, 5, or greater.

Figure 7C:
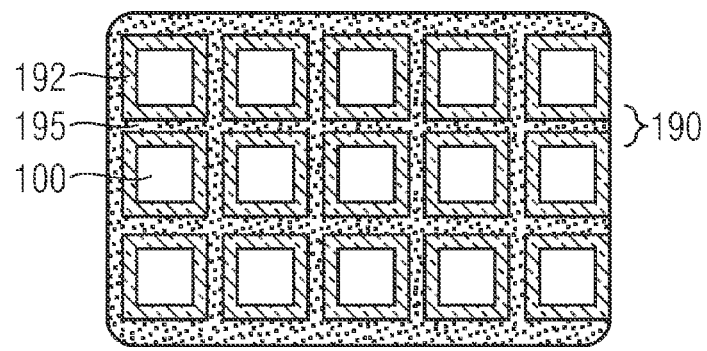
FIG. 7C is a schematic cross-sectional view of a section of a semiconductor device parallel to a first surface of a semiconductor body in accordance with an embodiment related to trench structures forming a grid.

FIG. 7C refers to an embodiment with trench structures 190 forming a grid. Dielectric structures 192 separate the recombination structures 195 forming a grid against dot-shaped portions of the semiconductor body 100. For embodiments as described with regard to FIG. 6B, extension portions 120a of the doped layer 120 may be formed in a part of the dot-shaped portions of the semiconductor body 100.

Figure 8A:
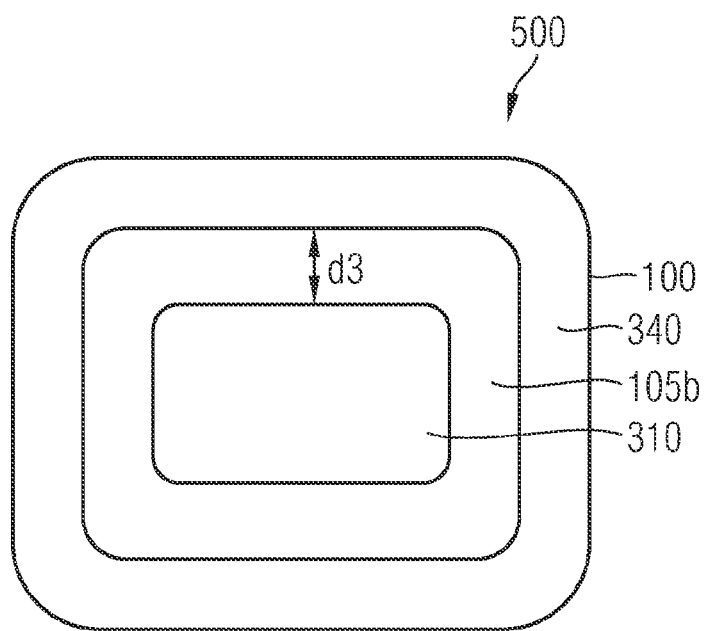
FIG. 8A is a schematic plan view on a semiconductor device for illustrating dimensional relationships according to a further embodiment.

FIG. 8A shows a plan view of a semiconductor device 500. In a cell area, a first electrode layer 310 provides an anode electrode. Below the anode electrode a highly doped base portion of a p-type doped zone forms an anode region. In an outer portion of an edge area surrounding the cell area an edge termination construction that may include a field plate 340 is provided that may extend along an edge of the semiconductor body 100. A field stop portion 105b of the p-type doped zone 105 may protrude from the cell area into an inner portion of the edge area, wherein the inner portion has a width d3. The width of the inner portion may be larger than the diffusion length of the charge carriers in the field stop portion. According to an embodiment, the width of the inner portion is at least three times the diffusion length of the charge carriers in the field stop portion 105b. The inner portion may be not greater than the ambipolar diffusion length or not greater than three times the ambipolar diffusion length, by way of example. The field stop portion 105b may be absent in the area of the edge construction.

Figure 8B:
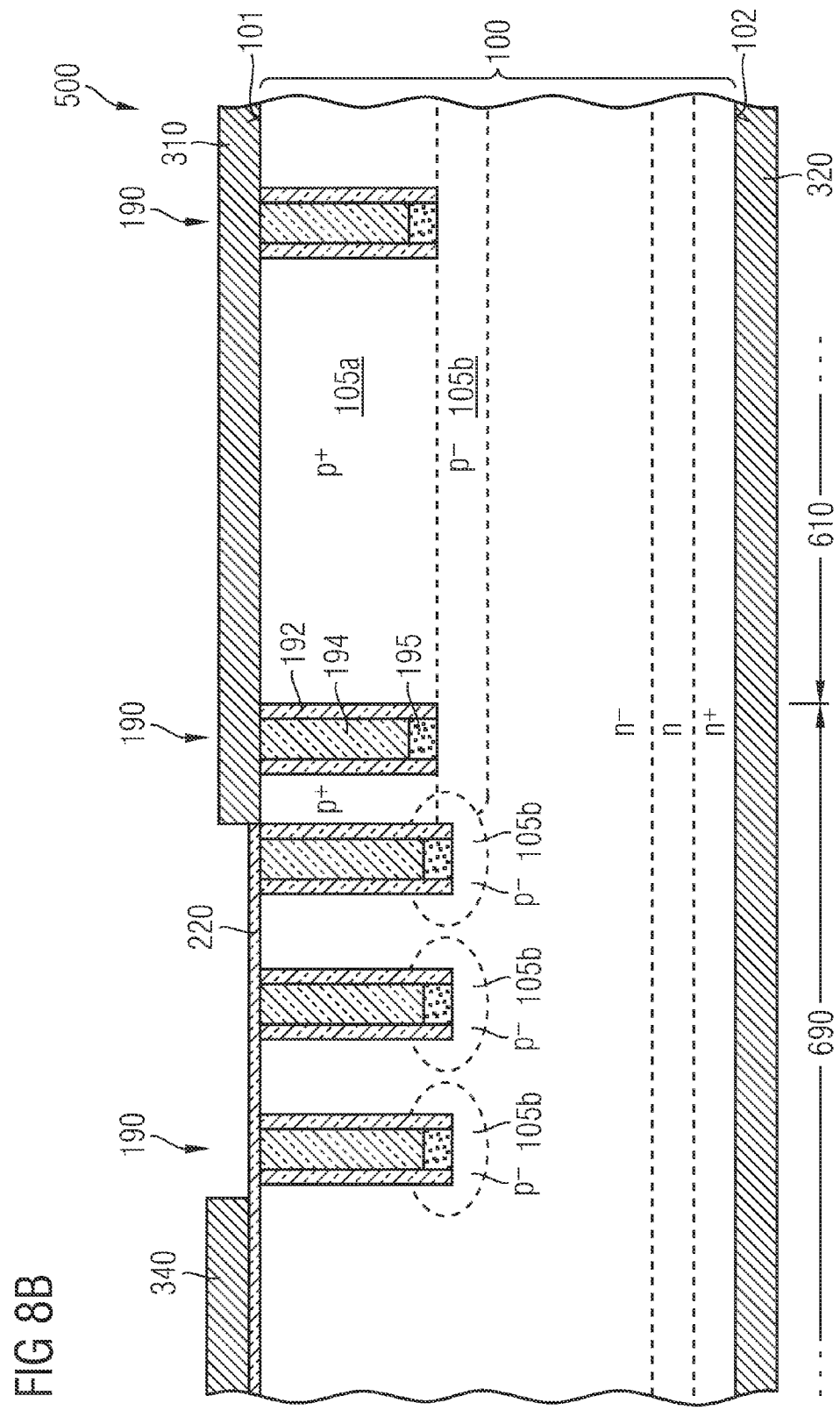
FIG. 8B is a schematic cross-sectional view showing details of an edge termination construction of a semiconductor device according to a further embodiment.

FIG. 8B shows a cross-sectional view of a semiconductor device 500 combining the cell area of FIG. 5A with an edge termination construction discussed above. A field plate 340 may be provided in an edge area 690 of a semiconductor body 100. According to the illustrated embodiment, the field plate 340 may be arranged in an outer portion of the edge area 690 oriented to the edge of the semiconductor body 100 and at a distance to a first electrode layer 310 which may provide a source electrode. For example, the field plate 340 may be absent in an inner portion of the edge area 690. According to another embodiment, the field plate 340 may be provided in an inner portion of the edge area 690 oriented to a cell area 610 and at a distance to the edge of the semiconductor body 100 or both in the inner and the outer portion of the edge area 690. The field plate 340 may be connected with the first electrode layer 310 or may be separated from the first electrode layer 310.

A dielectric layer 220 may insulate the field plate 340 from at least portions of the semiconductor body 100. The dielectric layer 220 may have a uniform thickness and the field plate 340 may be a one-step field plate. Alternatively, the thickness of the dielectric layer 220 may increase with decreasing distance to the edge and the field plate 340 may be a multi-step field plate. In addition to or as an alternative for the field plate 340, the outer portion of the edge area 690 may provide elements of further edge termination constructions, for example guard rings, a channel stopper, a low-doped JTE (junction termination extension), or a VLD (variation of lateral doping) structure, as well as a passivation layer, for example a polyimide, a silicon oxide or a glass.

In the cell area 610 surrounded by the edge area 690, highly doped base portions 105a form an anode region. The highly doped base portions 105a are absent in the edge area 690. Field stop portions 105b are formed both in the cell area 610 and in the inner portion of the edge area 690. The field stop portions 105b in the inner portion of the edge area 690 may be formed aligned to the trench bottoms of the trench structures 190. In the cell area 610, the field stop portions 105b may be formed aligned to the trench bottoms of the trench structures 190 or may be formed as a layer as illustrated. The inner portion has a width larger, for example three times larger, than the ambipolar diffusion length of the charge carriers. The width of the inner portion may be less than four times the ambipolar diffusion length of the charge carriers.

Figure 9:
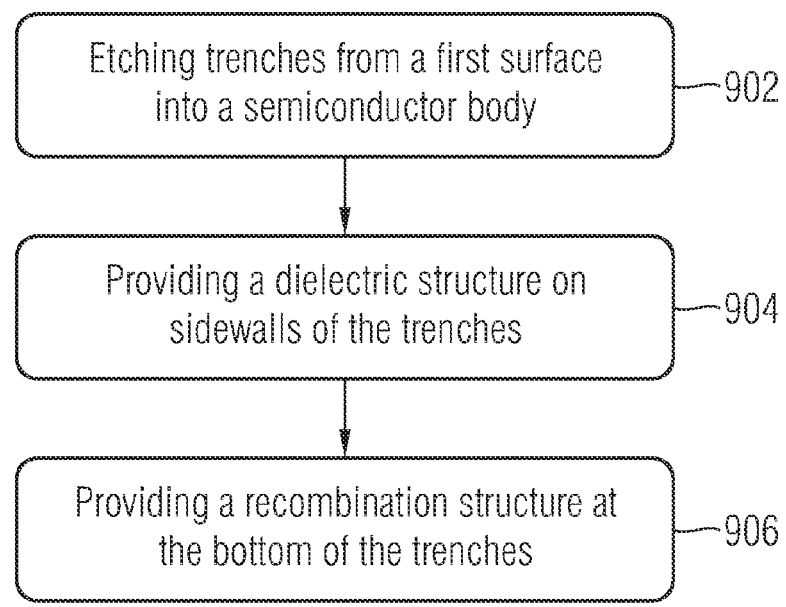
FIG. 9 is a schematic flow chart of a method of manufacturing a semiconductor device in accordance with a further embodiment.

FIG. 9 illustrates an embodiment of a method of manufacturing a semiconductor device. Trenches are etched from a first or a second surface into a semiconductor body that includes one or more doped zones of a second conductivity type adjoining the first surface and a doped layer of a first conductivity type which is opposite to the second conductivity type (902). On sidewalls of the trenches a dielectric structure is provided (904). A recombination structure is formed at the bottom of each trench (906). According to an embodiment, the recombination structure is a metal silicide.

The metal silicide may be provided by depositing a metal, for example titanium or cobalt. An anneal is performed to form a metal silicide in regions where the deposited metal is in contact with a silicon semiconductor body. Non-silicided portions of the deposited metal are removed and at least portions of the trenches may be filled with a fill material, for example a dielectric material or a conductive material which is not electrically connected with conductive structures outside the trench structures.

According to a further embodiment, before generating the recombination structure, an implant providing the impurities for segmented field stop portions may be implanted at the bottom of the trenches, for example ahead of or after providing dielectric structures along the sidewall of the trenches.

Since the required impurity concentration is significantly lower than the impurity concentration in the base portion of the doped zone, the implant may be performed without an implant mask.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor diode, comprising:
   a monocrystalline semiconductor body comprising:
      a doped layer of a first conductivity type and comprising a continuous portion and extension portions extending from a first surface of the semiconductor body to the continuous portion; and
      doped zones forming pn junctions with the continuous portion, wherein the doped zones extend from the first surface to the continuous portion, wherein the doped zones and the extension portions are in direct low-resistive contact with an anode electrode directly formed on the first surface; and
   trench structures extending from the first surface into the semiconductor body and horizontally separating the extension portions from base portions of the doped zones, the trench structures (i) not comprising electrically conductive structures or (ii) comprising a recombination structure, a fill structure between the first surface and the recombination structure and a dielectric structure laterally separating the fill structure from the semiconductor body.

2. The semiconductor diode of claim 1, further comprising a metal layer adjoining the first surface.

3. The semiconductor diode of claim 1, wherein the trench structures contain a gaseous fluid.

4. The semiconductor diode of claim 1, wherein the trench structures comprise or consist of one or more dielectric structures.

5. The semiconductor diode of claim 1, wherein the trench structures comprise or consist of a conductive structure directly adjoining the doped zones and forming first portions of a first electrode structure.

6. The semiconductor diode of claim 5, wherein the first electrode structure comprises a second portion directly adjoining the first surface.

7. The semiconductor diode of claim 1, wherein a maximum depth of the trench structures is less than a distance between the first surface and a planar interface between the doped zones and the doped layer, the planar interface being parallel to the first surface.

8. The semiconductor diode of claim 1, wherein the extension portions adjoin the first surface and the continuous portion and the doped zones form at least in parts planar interfaces parallel to the first surface.

9. The semiconductor diode of claim 8, wherein:
   a distance between the at least in parts planar interface and the first surface is greater than a maximum depth of the trench structures; and
   the doped zones comprise diffusion portions, each diffusion portion extending around a bottom portion of one of the trench structures, a distance between neighboring diffusion portions being narrower than a distance between trench structures assigned to an intermediate extension portion of the doped layer.

10. The semiconductor diode of claim 1, wherein the recombination structure is at a bottom of the trench structures, respectively, the recombination structure directly adjoining the doped zones, the recombination structure exhibiting a surface recombination rate of at least $10^4$ cm/s at an interface to the doped zones.

11. The semiconductor diode of claim 10, wherein the recombination structure consists of or contains a metal or a conductive metal compound.

12. The semiconductor diode of claim 10, wherein the recombination structure consists of or contains at least one of a material selected from a group containing amorphous semiconductor material, nanocrystalline semiconductor material, microcrystalline semiconductor material, polycrystalline semiconductor material and highly damaged monocrystalline semiconductor material.

13. The semiconductor diode of claim 10, wherein the dielectric structure separates the corresponding recombination structure from the semiconductor body in a lateral direction parallel to the first surface.

14. The semiconductor diode of claim 10, wherein the fill structure separates the recombination structure from the first surface.

15. The semiconductor diode of claim 10, wherein the doped zones comprise a field stop portion arranged between a buried edge of the trench structures and the doped layer.

16. The semiconductor diode of claim 15, wherein the field stop portion is a contiguous layer forming planar interfaces with the doped zones and the doped layer.

17. The semiconductor diode of claim 15, wherein the field stop portion comprises segments aligned to the trench bottoms and separated from each other.

18. The semiconductor diode of claim 15, wherein the field stop portion is separated from the doped zones.

19. The semiconductor diode of claim 18, wherein the continuous portion forms interfaces with the doped zones, the interfaces being parallel to the first surface.

20. The semiconductor diode of claim 15, wherein the field stop portion has an extension along a direction vertical to the first surface that is larger than a carrier diffusion length in the field stop portion.

21. The semiconductor diode of claim 15, wherein the field stop portion has an extension along a direction vertical to the first surface that is larger than three times a carrier diffusion length in the field stop portion.

22. The semiconductor diode of claim 1, wherein the doped zones are formed in a cell area of the semiconductor body and is absent in an edge area surrounding the cell area, and the trench structures are formed in the cell area.

23. The semiconductor diode of claim 1, wherein the trench structures are spaced at distances from 0.2 to 30 µm.

24. The semiconductor diode of claim 1, wherein the fill structure comprises a conductive material without electrical connection to the recombination structure.

25. The semiconductor diode of claim 1, wherein the extension portions comprise contact portions directly adjoining the first surface, wherein a mean dopant concentration in the contact portions is higher than in a portion of the extension portions outside the contact portions.

* * * * *